US006649531B2

United States Patent
Cote et al.

(10) Patent No.: US 6,649,531 B2
(45) Date of Patent: Nov. 18, 2003

(54) PROCESS FOR FORMING A DAMASCENE STRUCTURE

(75) Inventors: William J. Cote, Poughkeepsie, NY (US); Timothy J. Dalton, Ridgefield, CT (US); Prakash Chimanlal Dev, Plano, TX (US); Daniel C. Edelstein, White Plains, NY (US); Scott D. Halle, Hopewell Junction, NY (US); Gill Yong Lee, Wappingers Falls, NY (US); Arpan P. Mahorowala, Bronxville, NY (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 09/994,340

(22) Filed: Nov. 26, 2001

(65) Prior Publication Data

US 2003/0100190 A1 May 29, 2003

(51) Int. Cl.$^7$ ............................................. H01L 21/302
(52) U.S. Cl. ..................................... 438/714; 438/725
(58) Field of Search ................................. 438/700, 702, 438/706, 707, 710, 714, 717, 723, 725

(56) References Cited

U.S. PATENT DOCUMENTS

| | | | |
|---|---|---|---|
| 4,099,999 A | * 7/1978 | Burnham et al. ............. 438/43 |
| 5,661,083 A | 8/1997 | Chen et al. ................. 438/637 |
| 5,710,079 A | 1/1998 | Sukharev .................... 438/778 |
| 5,770,523 A | 6/1998 | Hung et al. ................. 438/725 |
| 5,861,064 A | 1/1999 | Oikari et al. ................. 134/26 |
| 5,902,702 A | 5/1999 | Nakao et al. .................. 430/5 |
| 5,970,376 A | 10/1999 | Chen ........................... 438/637 |
| 6,013,582 A | 1/2000 | Ionov et al. ................. 438/738 |
| 6,017,817 A | * 1/2000 | Chung et al. ................ 438/637 |
| 6,080,529 A | 6/2000 | Ye et al. ...................... 430/318 |
| 6,097,095 A | 8/2000 | Chang ......................... 257/774 |
| 6,350,700 B1 | * 2/2002 | Schinella et al. ........... 438/723 |
| 6,372,635 B1 | * 4/2002 | Wang et al. ................. 438/638 |
| 6,429,121 B1 | * 8/2002 | Hopper et al. .............. 438/636 |

FOREIGN PATENT DOCUMENTS

| | | |
|---|---|---|
| JP | 06296340 | 11/1994 |
| JP | 54007275 | 1/1997 |
| JP | 09304023 | 11/1997 |

OTHER PUBLICATIONS

Ruth DeJule, "Dual–Damascene: Overcoming Process Issues", Jun. 2000, "www.semiconductor.net."

* cited by examiner

*Primary Examiner*—Kin-Chan Chen
(74) *Attorney, Agent, or Firm*—Steven Capella; Cantor Colburn LLP

(57) ABSTRACT

A process for forming a damascene structure includes depositing a bilayer comprising a first dielectric layer and a second dielectric layer onto a substrate, wherein the first layer has a dielectric constant higher than the second layer, and wherein the second layer is selected from a low k dielectric material comprising Si, C, O and H. The multi-step damascene structure is patterned into the dielectric bilayer using highly selective anisotropic reactive ion etching. Photoresist, polymers and post etch residues are removed from the substrate using a plasma ashing process without damaging the underlying dielectric layers.

20 Claims, 5 Drawing Sheets

PROCESS FOR FORMING A DAMASCENE STRUCTURE

BACKGROUND OF THE INVENTION

The disclosure relates to the fabrication of integrated circuits and more particularly, to an interconnect structure and a process for forming the interconnect structure.

Integrated circuits are now transitioning from aluminum to copper metal interconnects as device generation goes beyond 0.25 micron design rules. Aluminum metal is limited for these design rules due to its inability to reliably carry current in smaller sized circuit lines. Copper has lower resistivity than aluminum so it can carry more current in smaller areas, thus enabling faster and denser chips with increased computing power. Moreover, the integration of copper reduces the number of interconnect levels required and consequently removes numerous processing steps which directly impact overall yield. Beyond the 0.25 micron generation of devices, current densities can reach levels that induce electromigration failure of traditional doped aluminum conductors. The increased electromigration resistance of copper relative to aluminum overcomes this limitation, which primarily impacts the finest pitch lines found at the lower interconnect levels.

Along with the transition to copper is the improvement upon the dielectric insulating layers. Silicon dioxide has been traditionally used as the primary material for insulators and has a dielectric constant of about 4.0. New insulating materials for interconnects, such as low k dielectrics, have been proposed, which lower interconnect capacitance and crosstalk noise to enhance circuit performance. The low k dielectric materials (a film having a low capacitance and a low resistance) that have been considered typically include materials containing Si, C, O and H and have a dielectric constant less than about 3.5. The low k materials may be polymeric or non-polymeric. Some examples of low k dielectrics include organosilicate glasses, methylsiloxane, methylsesquioxanes, hydrogen silsesquioxanes, polyimides, parylenes, fluorocarbons, benzocyclobutenes and other organic and inorganic materials.

Fabrication of integrated circuits using copper interconnects and low k dielectrics presents new challenges and problems for the semiconductor manufacturer. In order to make these devices, the manufacturers commonly use a damascene process. The damascene process uses most of the same chipmaking technologies to form the interconnect as the traditional structure but differs in the way in which the structure is built. Instead of etching a pattern in the metal film and surrounding it with a dielectric material, the damascene process typically includes etching a pattern into the dielectric film, then filling the pattern with copper. An advantage to the damascene process is that the metal etch is replaced with a simpler dielectric etch as the critical step that defines the width and spacing of the interconnect lines.

During a dual damascene process, there are typically four etches: via, trench, photoresist and polymer strip, and bottom barrier removal. Each has challenges irrespective of damascene strategy. For example, during the via etch, selectivity of the resist, selectivity of the bottom barrier and profile in the bottom of the via are critical. Key in the trench etch is maintaining the integrity of the bottom barrier while not impacting the desired lateral dimensions of the trench. With regard to photoresist and polymer removal, prior art ashing techniques can result in pullback of the dielectric film or may cause an increase in the effective k value of the dielectric film. Other problems include lithography and patterning of photoresists on the low k dielectric surface.

One of the methods used to directly etch or strip materials from semiconductor surfaces is a Reactive Ion Etch (RIE) plasma process. RIE is highly anisotropic and can be used to selectively etch a layer with well defined vertical walls. Such plasmas are formed within a carefully designed reactor chamber by the exposure of appropriate gases to radio frequency energy while controlling the bias voltage developed on the substrate. The gases must be chosen with specific consideration to the material desired to be etched. In particular, the product obtained from the reaction between the gas plasma and the material surface must be sufficiently volatile to be removed from the material surface by the reactor system. In the practice of reactive ion etching of a material surface, the reactive gases are introduced into a reactor chamber at reduced pressure. The chamber is then energized through the introduction of radio frequency (RF) energy, which allows the reactive gases to transform into reactive species which in turn can be used to selectively etch portions of the exposed surfaces.

Current RIE processes are generally problematic for use with the new low k dielectric materials. The new low k dielectrics typically contain carbon within its structure making these materials more resist-like. The presence of carbon has been found to reduce the selectivity for current RIE processes. A reduction in selectivity can affect the critical dimensions patterned into the dielectric. It is important to maintain a critical dimension (CD) for the various features patterned into the substrate within a tightly controlled specification as well as promote proper underlayer surface conditions so that additional layers may be deposited or formed. Small deviations in the patterned profiles formed in the underlayers can adversely impact device performance, yield and reliability of the final integrated circuit. Moreover, most current RIE plasmas typically are generated from oxygen-containing gases that are selective for removing traditional dielectrics, such as $SiO_2$, relative to a photoresist mask. It has been found that these types of oxygen-containing plasmas readily damage certain low k materials used in advanced integrated circuit manufacture. Exposure of the low k materials to the oxygen-containing plasma can raise the dielectric constant of the low k dielectric underlayers during plasma processing. The increases in dielectric constant affects, among others, interconnect capacitance, which directly impacts device performance.

The process of removing the photoresist mask, polymers and post etch residues after the features have been etched into the substrate is generally known as stripping or ashing. The stripping or ashing process must exhibit high selectivity since small deviations in the etched profiles can adversely impact device performance, yield and reliability of the final integrated circuit. Since most of the new low k dielectrics contain carbon within their structure, current processes exhibit reduced selectivity. Moreover, the current processes for ashing or stripping photoresist from new low k dielectric materials can result in pullback of the dielectric film and/or cause an increase in the effective k value of the dielectric film.

SUMMARY OF THE INVENTION

A method of forming a damascene structure includes depositing a bilayer comprising a first dielectric layer and a second dielectric layer onto a barrier layer of a substrate, wherein first layer has a dielectric constant higher than the second layer. The second layer is selected from a low k dielectric material comprising Si, C, O and H. A first layer of photoresist is formed on the second dielectric layer and a via feature is patterned in the photoresist, wherein the via feature exposes a portion of the second dielectric layer. The substrate is then exposed to a first reactive ion etching process, wherein the first reactive ion etch process anisotropically removes the exposed portion of the second dielectric layer to expose a portion of the first dielectric layer. The substrate is then exposed to a second reactive ion etching process, wherein the second reactive ion etch process anisotropically removes the exposed portion of the first layer to expose a portion of a barrier layer. The first photoresist layer, polymers and post etch residues are stripped from the substrate.

A planar coating of an anti-reflective layer is applied to the substrate and a second photoresist layer is formed on the anti-reflective layer. The second photoresist layer is patterned to form a trench feature, wherein the trench feature exposes a portion of the anti-reflective layer. The substrate is exposed to a third reactive ion etching process to anisotropically partially remove the exposed portion of the anti-reflective layer and further remove a portion of the underlying second layer. The anti-reflective layer, the photoresist, polymers and post etch residues are then stripped from the substrate. The substrate is then exposed to a fourth reactive ion etching process to anisotropically remove the exposed portion of the barrier layer.

The process may further include depositing a seed layer onto the substrate. A copper metal layer is then deposited onto the seed layer; and polished. A second barrier layer is then deposited onto the substrate.

The process for removing the photoresist from the substrate includes exposing the photoresist to a reactive plasma, wherein a gas mixture for forming the plasma consists essentially of ethylene, oxygen and nitrogen; and selectively removing the photoresist layer from the underlying layer, wherein the underlying layer is substantially the same as before exposing the photoresist to the plasma.

The above described and other features are exemplified by the following figures and detailed description.

DETAILED DESCRIPTION OF PREFERRED EMBODIMENTS

A process for the formation of electrical interconnect lines between different layers in a semiconductor device is described. Advantageously, the process overcomes a number of problems noted in the prior art. For example, the process employs a low k dielectric bilayer that does not result in pullback of the dielectric film or cause an increase in the effective k value of the dielectric film. Moreover, lithographic patterning of photoresists on the dielectric bilayer results in well defined feature. The process provides novel RIE chemistry that provides high etch selectivity and CD control. The RIE process can be adapted to selectively strip or ash residual photoresist and post etch residues.

Referring now to FIGS. 1(A–J), there is depicted a dual damascene process flow suitable for practicing the present invention. The illustrated dual damascene process flow is exemplary only. It is understood that a variety of damascene process strategies could be used.

Figure 1A:
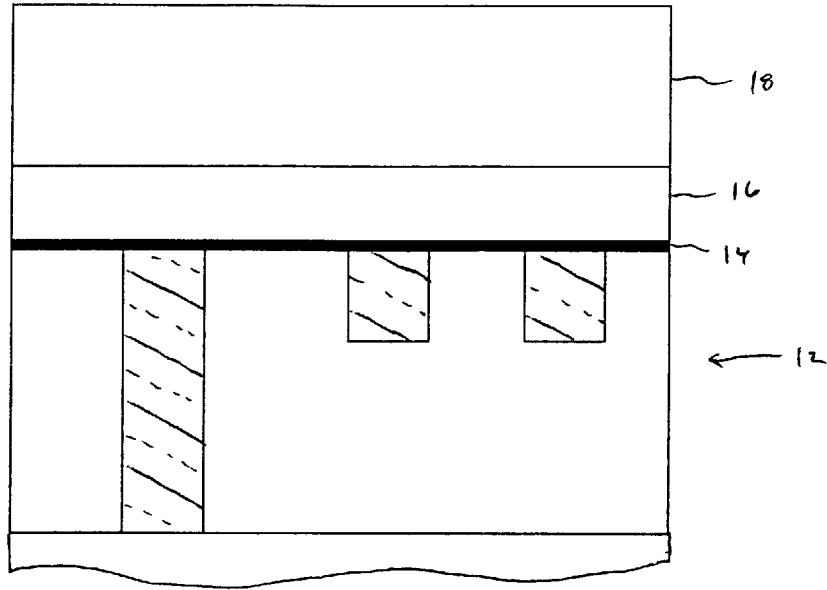
FIGS. 1(A–J) is a cross sectional view showing a damascene process flow for fabricating an interconnect structure.

As shown in FIG. 1A, the damascene process flow is shown occurring on a substrate 10 having a first conductor layer generally designated 12. The substrate 10 may be a semiconductor wafer or chip which is composed of any Si-containing semiconductor material such as, but not limited to Si, SiGe, Si/SiGe, silicon-on-insulator and other like Si containing semiconductor materials. The substrate may be of the n- or p-type depending on the desired device to be fabricated. Moreover, the substrate may contain various isolation and/or device regions formed in the substrate or on a surface thereof. The substrate may also contain metallic pads on the surface thereof. For clarity, the above mentioned regions and metallic pads are not shown in the drawings, but are nevertheless meant to be included with the substrate. In addition to Si-containing semiconductor materials, the substrate may also be a circuit that includes CMOS devices therein, or alternatively, substrate may be one of the interconnect levels of the interconnect structure.

The first conductor layer 12 includes a completed metal interconnect and a dielectric layer. An optional thin capping layer 14 of silicon nitride, silicon oxycarbide, silicon oxynitride, silicon nitride carbide, silicon carbide or the like is deposited onto the first metal layer. The dielectric capping layer 14, if needed, generally serves as, among others, an etch stop, an adhesion promoter for copper metal deposition and also provides protection to the underlying first metal layer 12. i.e., a barrier layer.

A bilayer dielectric structure comprising a first layer 16 and a second layer 18 is formed or deposited onto the etch stop layer 14. The first layer 16 is selected to have a higher dielectric constant than the second layer 18. In a preferred embodiment, the first layer is silicon dioxide. The dielectric constant of silicon dioxide is about 4.0. The silicon dioxide layer is preferably deposited using standard plasma enhanced chemical vapor deposition (PECVD) or high density plasma chemical vapor deposition (HDP CVD) processes generally known to those in the art. Alternatively, the first layer 16 may instead comprise a hybrid dielectric structure, such as those hybrid structures described in U.S. patent Ser. No. 09/596,750, now U.S. Pat. No. 6,548,901, herein incorporated by reference in its entirety.

The second layer 18 is preferably a low k dielectric film containing Si, C, O, and H and has a dielectric constant less than then first layer. Preferably, the dielectric constant is less than or about 3.5. More preferably, the second layer 18 is a nonpolymeric hydrogenated oxidized silicon carbon layer (SiCOH) having a dielectric constant of about 2.7 to about 2.9. Hydrogenated oxidized silicon carbon and processes for deposition thereof are generally described in U.S. Pat. No. 6,147,009 to Grill et al., herein incorporated by reference in its entirety. Preferably, the second layer, i.e., hydrogenated oxidized silicon carbon layer, is deposited by PECVD or HDP CVD from a gas mixture containing an organosilicon precursor gas and an oxygen-providing gas, which are substantially free from nitrogen. Preferably, the precursor gas contains at least one organosilicon compound having a ring structure. Suitable organosilicon precursor gases include molecules with ring structures such as 1,3,5,7-tetramethylcyclotetrasiloxane (TMCTS, or $C_4H_{16}O_4Si_4$), tetraethylcyclotetrasiloxane ($C_8H_{24}O_4Si_4$), or decamethylcyclopentasiloxane ($C_{10}H_{30}O_5Si_5$) or other cyclic methyl siloxanes. However, other precursors comprising Si, C, O and H containing gases that are substantially free from nitrogen may also be used. Such precursors may be selected from the group of methylsilanes, such as tetramethylsilane ($Si(CH_3)_4$), or trimethylsilane ($SiH(CH_3)_3$). The oxygen-providing gas includes those compounds that contain oxygen. Preferably, the oxygen providing gas is selected from the group consisting of oxygen, carbon monoxide, carbon dioxide, water vapor, ozone and mixtures thereof.

Figure 1B:
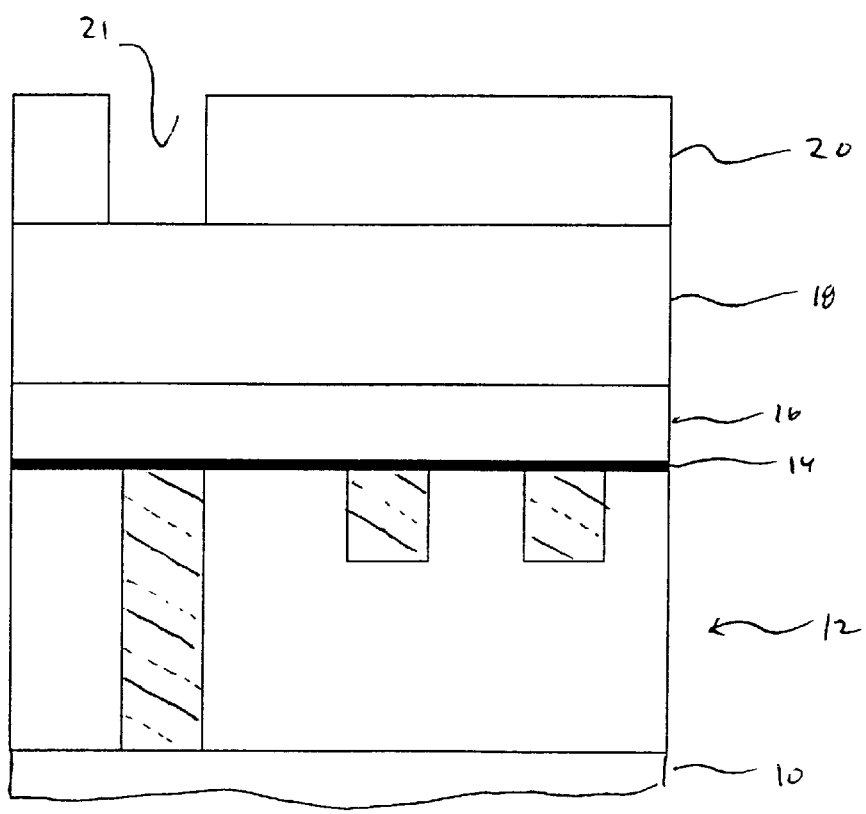

In FIG. 1B, a photoresist layer 20 is coated onto the second dielectric layer 18, selectively patterned by exposure to activating energy and subsequently developed to form a relief image in the photoresist. The relief image, as shown, includes the formation of a via 21 that exposes a portion of the second dielectric layer 18. As used herein, the term "via" or "contact" refers to vias, trenches, grooves, contact holes, and the like in a substrate.

It has advantageously been found that photolithographic patterning of the resist on the second dielectric layer 18, i.e., hydrogenated oxidized silicon carbon layer, does not result in footing. As is known to those skilled in the art, footing may be caused by a chemical interaction occurring at an interface between the exposed regions of photoresist and the underlying layer. In the case of photoresists employing an acid amplification mechanism, the exposed regions contain catalytic amounts of acid for providing a solubility differential during subsequent development between the exposed and unexposed regions of photoresist. Neutralization of the acid at the interface can lead to footing and/or prolonged exposure times Deep Ultraviolet (DUV) photoresists are optimized for exposure to radiation having a wavelength at about 248 nm. DUV photoresist formulations typically include a binder resin and a photoacid generator (PAG). The binder resins are typically modified polyvinyl phenol polymers or polyvinylphenol/acrylate copolymers in which the phenol or carboxylate groups are partially "blocked" or protected by moieties which can be chemically cleaved. As previously mentioned, these systems are based on an acid catalyzed mechanism wherein a strong acid is generated upon exposure of activating energy to a photoacid generator compound present in the photoresist formulation. A dissolution differential then exists between exposed (deprotected polymer) and unexposed (protected polymer) regions. It is this catalytic mechanism that is primarily responsible for the high sensitivity of these systems.

Photoresists optimized for exposure to radiation at 193 nm employ a variety of other protected polymers that necessarily contain few or no aromatic groups due to the strong absorption of 193 nm light to aromatic compounds. For example, some of these photoresists are based on acrylate polymers having various non-aromatic functional groups. Similar to DUV photoresists, these resists also utilize an amplification mechanism. The PAG chemistry of 193 nm resists is essentially the same as that of DUV resists.

At feature sizes of 0.13 micron and below it is anticipated that 157 nm wavelength light will be used for imaging. Photoimaging of these types of resists will likely require a vacuum since oxygen is know to strongly absorb at this wavelength. As such, a new generation of chemically amplified photoresist polymers will have to be designed to meet the challenging demands of lithography at this wavelength.

The footing phenomena of photoresists is especially problematic with low k dielectrics formed by PECVD from a gas mixture including a nitrogen containing gas. The use of a nitrogen containing gas can create free amine groups within the resulting dielectric structure. The free amine groups can interact at the interface with the catalytic amount of acid generated upon exposure of the photoresist to activating energy, thereby neutralizing some of the acid. As a result, subsequent development of the photoresist fails to remove or clear the amine poisoned areas resulting in footing. The use of the second layer 18 as described advantageously results in improved critical dimension (CD) control. In particular, the sidewalls of the via profiles are vertical and importantly, the dielectric/photoresist interface exhibits no footing.

Figure 1C:
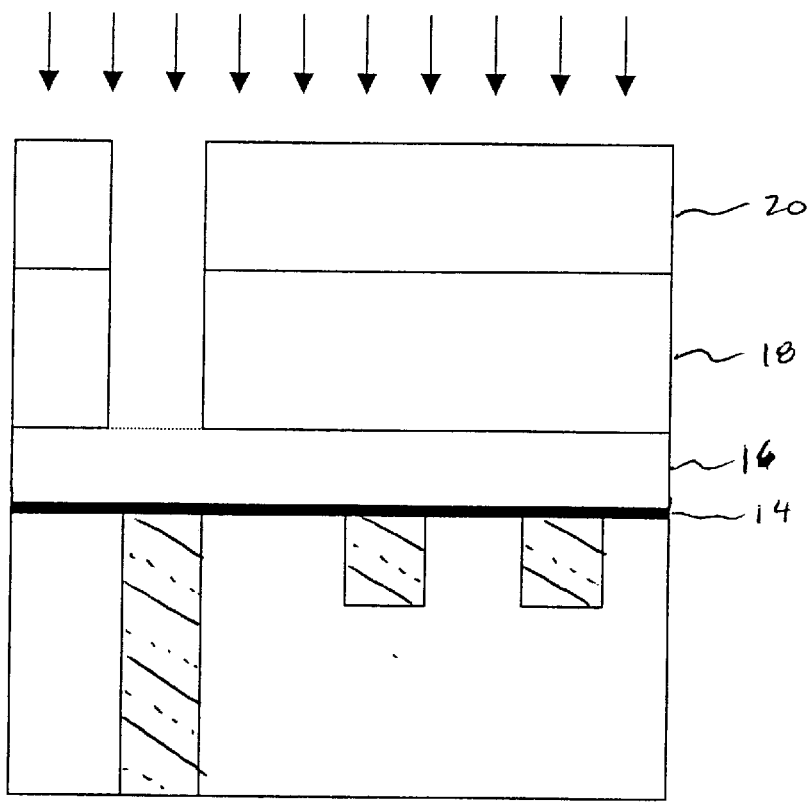

In FIG. 1C, an anisotropic etching process is performed to etch away the exposed portion of the second dielectric layer 18 until the silicon dioxide layer 16 is exposed. In a preferred embodiment, the anisotropic etching process is a reactive ion etching process. This step can be performed using commercially available reactive ion etch/downstream microwave plasma ashing systems. In a preferred embodiment, the removal of the second dielectric layer 18 is performed with a gas mixture containing $CHF_3$, $CF_4$, $O_2$ and argon, wherein the total pressure of all four gases is between about 5 millitorr (mT) and about 500 mT. With respect to the gas flow rates, the flow rate of $CHF_3$ is provided at about 20 standard cubic centimeters per minute (sccm), $CF_4$, is provided at a flow rate of about 60 sccm, $O_2$ is provided at a flow rate of about 5 sccm and argon is at about 400 sccm. With respect to power levels used to perform the ion etch, preferably the power level is maintained between about 100 Watts (W) and about 3000 W. The reactive ion etch is performed at a temperature of about 20° C. for a period of about 2 minutes. Alternatively, a dual frequency power may be employed using two RF generators, each powered between about 100 and about 2000 watts.

The reactive ion etching process parameters discussed herein refer to 200 mm sized wafers. As wafers scale from 200 mm to 300 mm, the flows and powers mentioned herein are expected to scale as well. Those skilled in the art will be able to optimize the process parameters for 300 mm sized wafers in view of this disclosure.

Figure 1D:
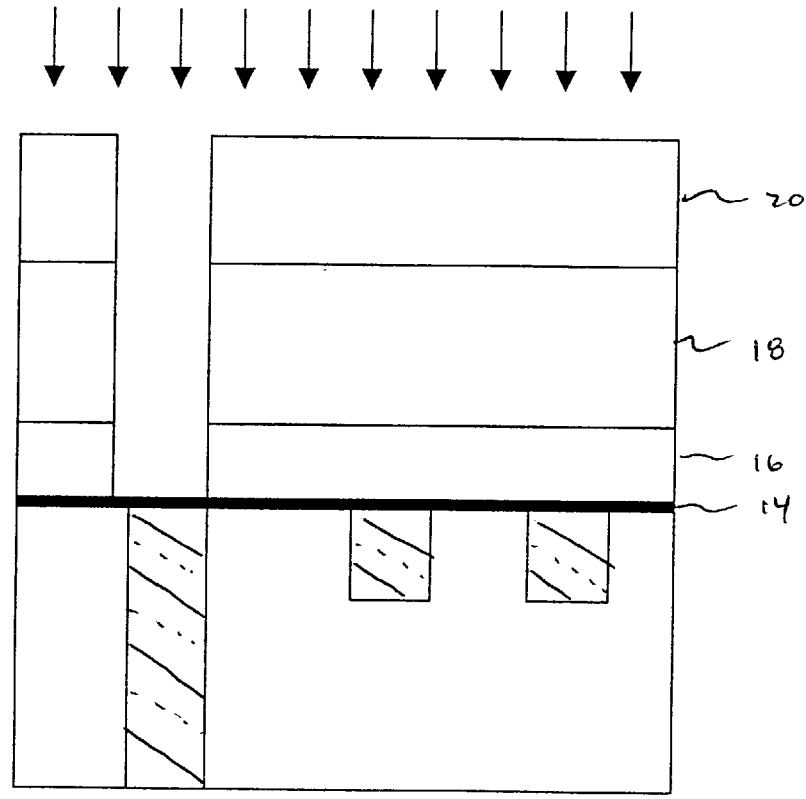

In FIG. 1D, the substrate is exposed to a different RIE chemistry selective for selectively removing the first dielectric layer 16, i.e, silicon dioxide. Preferably, the selective removal of the $SiO_2$ layer 16 is performed in the same apparatus described above used to perform the removal of the second dielectric layer 18, i.e., the SiCOH layer. Within the processing chamber, an atmosphere comprising carbon monoxide (CO), $C_4F_8$, $O_2$ and argon having a total pressure of between about 10 to about 200 mT is established. More preferably, a total pressure of about 28 mT is established. The flow rates for the gases are as follows: CO is at about 100 sccm, $C_4F_8$ is at about 6 sccm, $O_2$ is at about 5 sccm and argon is at about 100 sccm. The power used is maintained at about 3500 W at a temperature of about 20° C. until the first layer 16 is removed to the etch stop layer 14 as determined using standard methods known to those of skill in the semiconductor fabrication arts. Alternatively, as previously discussed, using a dual frequency power source, each generator will be powered between 100 and 2000 W. The resulting via has a high aspect ratio preferably between about 10:1 to less than about 1:1. More preferably, the resulting aspect ratio is about 3:1.

Figure 1E:
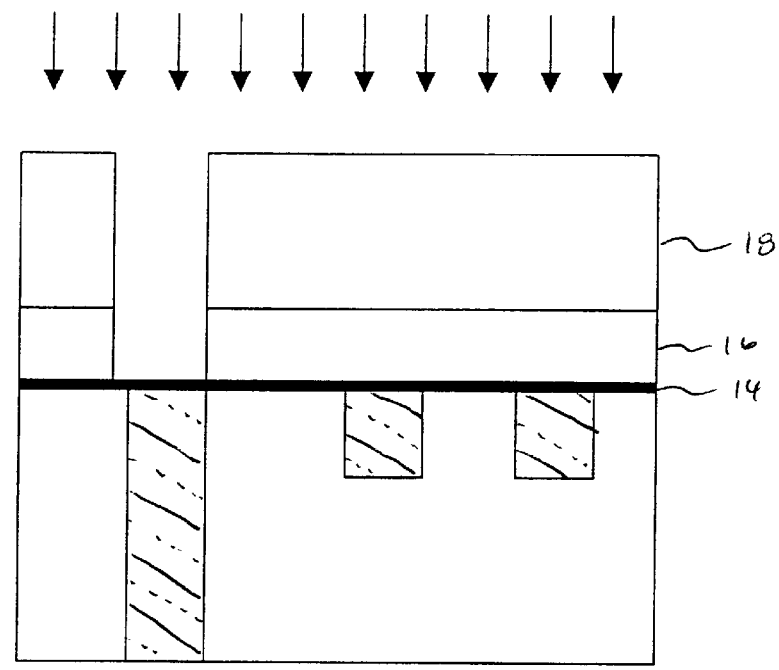

In FIG. 1E, residual photoresist, polymers and etch residues are removed by a plasma-mediated stripping or ashing process. Preferably, the photoresist, polymers and etch residues are removed in the same apparatus as described above. In one embodiment, a high density plasma reactive ion etching process (HDP RIE) is used. The plasma is formed from a gas mixture including $C_2H_4$, $O_2$ and nitrogen atmosphere having a total pressure between about 1 to about 100 mT. More preferably, the total pressure is about 10 mT. A flow rate for $C_2H_4$ is between about 5 to about 20 sccm; more preferably, the flow rate is about 11 sccm. A flow rate for $O_2$ is between about 10 to about 50 sccm; more preferably, the flow rate is about 20 sccm. A flow rate for nitrogen is between about 10 to about 200 sccm; more preferably, the flow rate is about 80 sccm. The power level used is maintained at a level between about 200 to about 2000 W, more preferably about 800 W with a plasma frequency between about 50 to about 500 Megahertz (MHz) and more preferably, from about about 1.6 to about 27 MHz. The processing is continued for a period of about 3 minutes at a temperature of about 20° C. The use of ethylene protects the sidewalls of the via during the stripping process and maintains the critical dimension within tightly controlled specifications. While not wanting to be bound by theory, it is believed the ethylene gas forms a polymer on the sidewall during the photoresist mask removal. Alternatively, other hydrocarbons may be used in addition to ethylene or in place of ethylene. Suitable hydrocarbons include methane, acetylene, $C_4H_8$, cyclic alkene, alkene or the like. Preferably, the hydrocarbons are a gas or vapor under plasma forming conditions.

In another embodiment, a high density plasma (HDP) RIE is generated from a gas mixture including $SO_2$, $O_2$ and Ar at about 10 mT. A flow rate for $SO_2$ is less than about 60 sccm, with a flow rate of about 20 sccm preferred. A flow rate for $O_2$ is less than about 60 sccm, with a flow rate of about 20 sccm preferred. For Ar, the flow rate is less than 500 sccm with a flow rate somewhat greater than 0 sccm preferred, i.e., a trickle amount. The power level used is maintained at a level between about 100 W to about 1000 W, with about 260 W source preferred, a bias from about 10 W to about 500 W with about 80 W preferred, and a plasma frequency of about 1.6 MHz to about 2.7 MHz, with about 13.56 MHz preferred. The processing is continued for a period of about 1.5 minutes at a temperature of about 10° C.

In another embodiment, the plasma is formed from a gas mixture including forming gas (4% $H_2$ in $N_2$), $CF_4$ and oxygen at 1000 mT. A flow rate for the forming gas is from about 100 to about 10000 sccm, with about 5000 sccm preferred. A flow rate for $CF_4$ is less than about 1000 sccm, with about 100 sccm preferred. For oxygen, the flow rate is somewhat greater than about 0 sccm. The power level used is maintained at a level from about 500 W to about 2500 W, with about 900 W preferred and a plasma frequency of about 13.56 Megahertz (MHz). The processing is continued for a period of about 30 seconds at a temperature of about 250° C. In yet another embodiment, the step may first be run without $CF_4$ for 1 to 3 minutes and then switched to the above named $N_2$—$H_2$/$CF_4$ plasma.

In another embodiment, the plasma is formed from a gas mixture of $N_2$, $H_2$, $NH_3$ or forming gas (10% $H_2$ in $N_2$), $CF_4$ and oxygen at a total pressure between about 20 to about 1000 mT. A flow rate for the gas mixture is between about 100 to about 2000 sccm. The power level used is maintained at a level between about 200 to about 2000 W. The processing is continued for a period of about 3 minutes at a temperature of about 0° C.

Advantageously, the photoresist stripping process is highly selective. For example, the critical dimension of the via is substantially unchanged after stripping. Moreover, there is no evidence of undercutting and the k value in the dielectric bilayer is substantially unchanged.

Figure 1F:
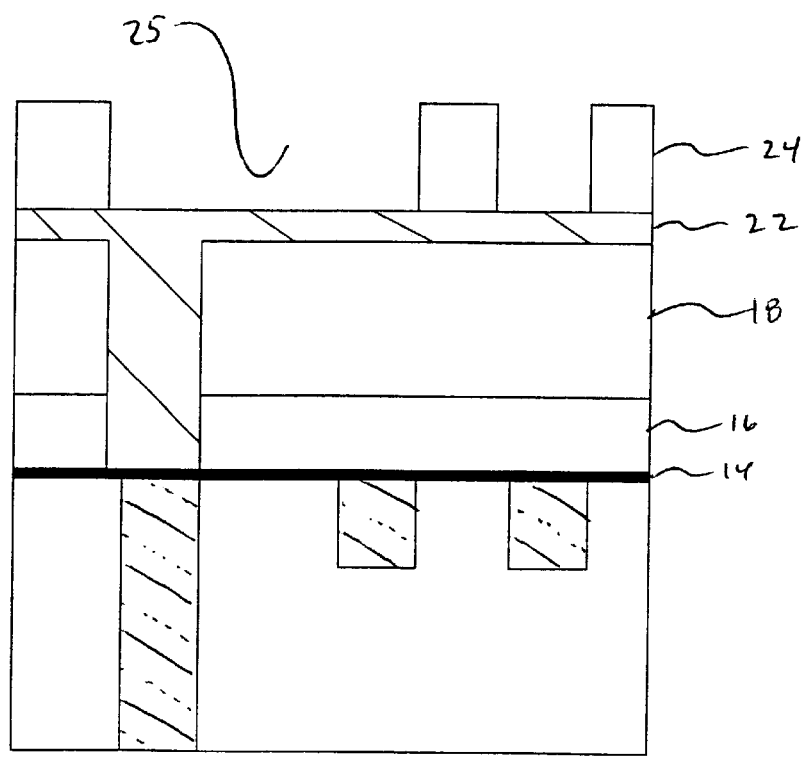

In FIG. 1F, a planarizing layer 22 of an anti-reflective coating (ARC) is formed on the substrate surface. A photoresist layer 24 is subsequently coated and patterned to form the line-level, e.g., a trench feature 25, using photolithographic techniques.

Figure 1G:
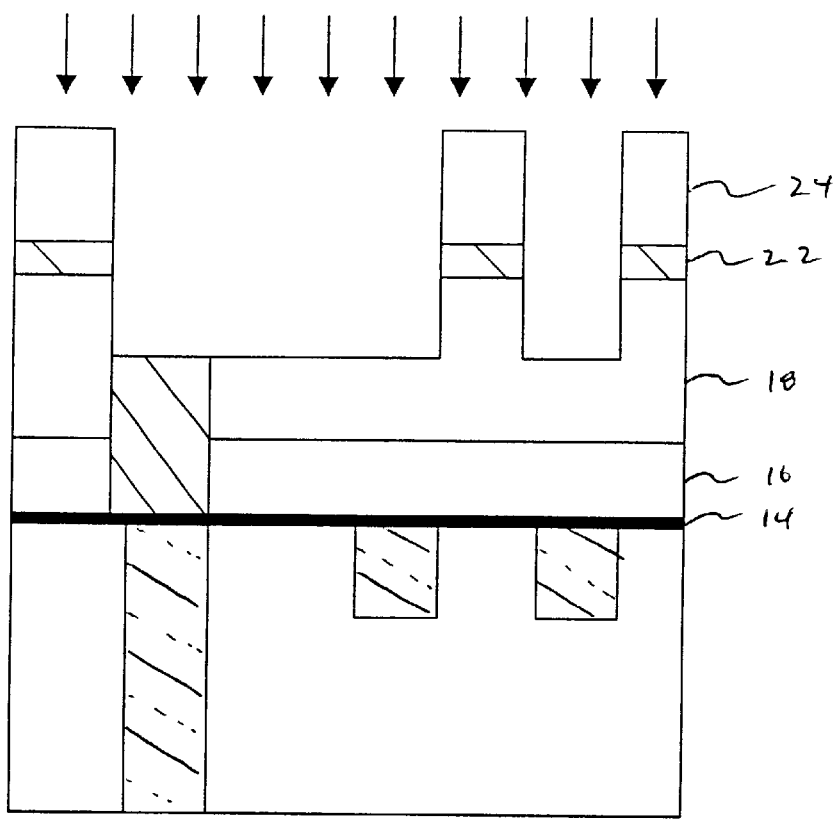

In FIG. 1G, the substrate 10 is exposed to an etching process for removing a portion of the second layer 18 to form the line level. Preferably, the same apparatus as described above is employed. In one embodiment, a selective anisotropic RIE process is used to remove the exposed regions of ARC on the substrate. The selective RIE plasma uses a gas mixture containing $N_2$, $O_2$, and CO at about 18 millitorr (mT). A flow rate for the $N_2$ gas is between about 10 to about 1000 sccm, for $O_2$ gas is between about 5 to about 50 sccm and for CO gas, it is between about 10 to about 200 sccm. More preferably, the flow rate for the $N_2$ gas is about 100 sccm, for $O_2$ gas at about 20 sccm and for CO gas at about 30 sccm. The power level used is maintained at a level between about 200 to about 1500 watts for a period of about 45 to about 180 seconds at a temperature of about 20° C. Then, a portion of the second layer 18 (SiCOH) is removed. The depth of removal is preferably time-based. The RIE plasma is generated from a gas mixture containing $CHF_3$, $CF_4$, $O_2$ and argon, wherein the total pressure of all four gases is about 60 mT. With respect to the gas flow rates, the flow rate of $CHF_3$ is provided at about 20 sccm, $CF_4$, is provided at a flow rate of about 60 sccm, $O_2$ is provided at a flow rate of about 5 sccm and argon is at about 400 sccm. With respect to power levels used to perform the ion etch, preferably the power level is maintained between about 100 W and about 2000 W. If using a dual frequency power source, each generator is maintained between about 100 W and about 2000 W. The reactive ion etch is performed at a temperature of about 20° C. for a period of about 30 seconds.

In another embodiment, the selective RIE plasma uses a gas mixture containing forming gas at 100 mT. A flow rate for the forming gas (10% hydrogen in nitrogen) is at about 500 sccm. The power level used is maintained at a level between about 100 W to 2000 W with a plasma frequency of about 13.56 to about 60 MHz. The processing is continued for a period of about 30 seconds at a temperature of about 20° C. to remove a portion of the anti-reflective layer to the second layer 18. Then, a portion of the second layer 18 (SiCOH) is removed as previously described utilizing a RIE plasma generated from a gas mixture containing $CHF_3$, $CF_4$, $O_2$ and argon. The invention is not intended to be limited to forming gas. Other hydrogen gas and noble gas combinations including $N_2$, $H_2$, $NH_3$, $N_2H_2$, Ar, He, Xe, Kr or the like may be utilized.

Figure 1H:
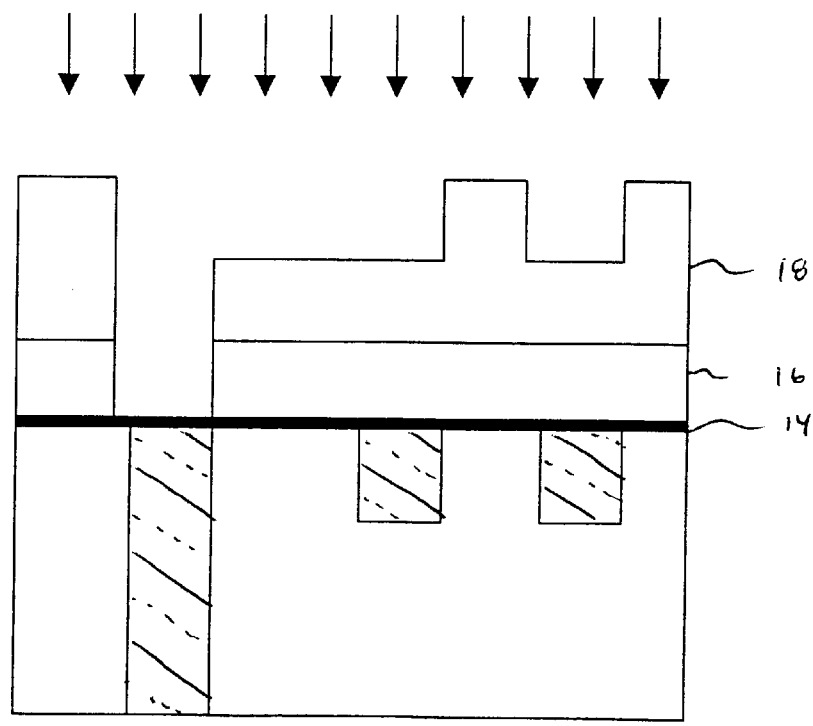

In FIG. 1H, residual photoresist, residual ARC, polymers and post-etch residues are selectively removed from the substrate using one of the plasma mediated ashing processes as previously described in FIG. 1E.

Figure 1I:
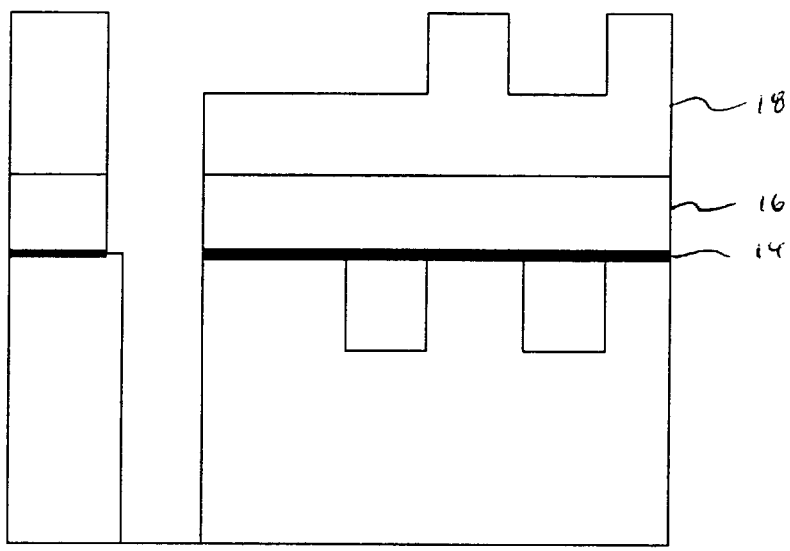

In FIG. 1I, the dielectric capping layer 14 is selectively removed. A RIE process for removing the layer is generated from a gas mixture containing $CHF_3$, $O_2$ and argon at about 12 mT. A flow rate for $CHF_3$, is at about 12 sccm, for $O_2$ at about 10 sccm and for argon at about 425 sccm. The power level used is maintained at a level between about 500 W to about 2000 W with a plasma frequency of about 1.6 to about 13.56 Megahertz (MHz). More preferably, the power level is at about 800 W and the plasma frequency is maintained between about 1.6 to about 2.2 MHz.

Figure 1J:
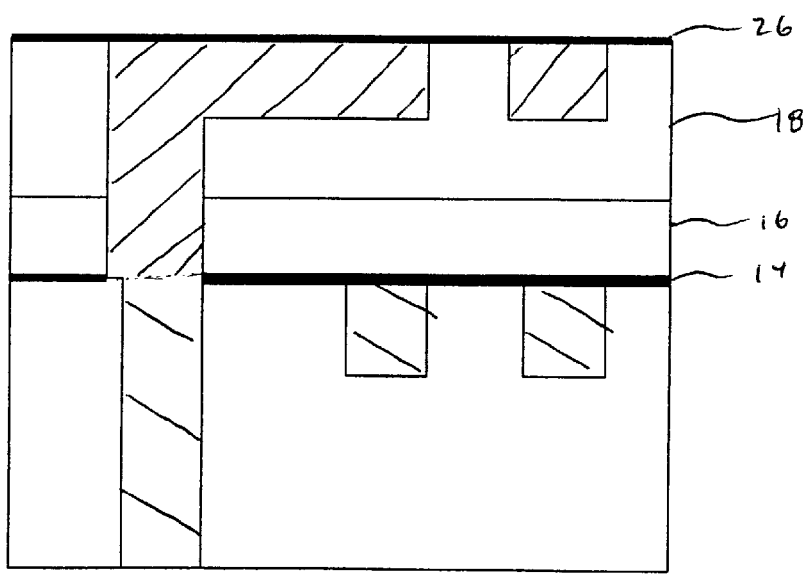

In FIG. 1J, a copper metal deposition process is used to fill the spaces left by the etching and stripping process to form the second metal layer. Current copper deposition techniques require the deposition of a barrier layer that also acts as a seed layer for subsequent copper deposition. After the copper has been deposited, the wafer surface is then planarized typically by a chemical mechanical polishing step. A barrier layer 26 is then deposited and the above described processes are repeated. In this manner, the integrated circuit or the like is formed.

While preferred embodiments have been shown and described, various modifications and substitutions may be made thereto without departing from the spirit and scope of the invention. Accordingly, it is understood that the present invention has been described by way of illustrations and not limitation.

We claim:

1. A method of forming a damascene structure, the method comprising:
   depositing a bilayer comprising a first dielectric layer and a second dielectric layer onto a barrier layer of a substrate wherein the first dielectric layer has a dielectric constant higher than the second dielectric layer, and wherein the second dielectric layer is a low k dielectric material comprising Si, C, O and H;
   forming a first layer of photoresist onto the second dielectric layer and patterning a via feature, wherein the via feature exposes a portion of the second dielectric layer;
   exposing the substrate to a first reactive ion etching process, wherein the first reactive ion etch process anisotropically removes the exposed portion of the second dielectric layer to expose a portion of the first dielectric layer;
   exposing the substrate to a second reactive ion etching process, wherein the second reactive ion etch process anisotropically removes the exposed portion of the first dielectric layer to expose a portion of the baffler layer;
   stripping the first photoresist layer, polymers and post etch residues from the substrate;
   applying a planar coating of an anti-reflective layer to the substrate and forming a second photoresist layer onto the anti-reflective layer, wherein the second photoresist layer is patterned to form a trench feature, wherein the trench feature exposes a portion of the anti-reflective layer;
   exposing the substrate to a third reactive ion etching process, wherein the third reactive ion etching process anisotropically removes the exposed portion of the anti-reflective layer and partially removes a portion of the underlying second dielectric layer;
   stripping the anti-reflective layer, the photoresist, polymers and post etch residues from the substrate; and
   exposing the substrate to a fourth reactive ion etching process, wherein the fourth reactive ion etching process anisotropically removes the exposed portion of the baffler layer.

2. The method according to claim 1 further comprising:
   depositing a seed layer after exposing to substrate to the fourth reactive ion etching process;
   depositing a copper metal layer onto the seed layer;
   polishing the metal layer; and
   depositing a second barrier layer.

3. The method according to claim 1, wherein the first reactive ion process comprises generating a plasma from a gas mixture consisting essentially of $CHF_3$, $CF_4$, $O_2$ and Ar.

4. The method according to claim 3, wherein the gas mixture further includes a noble gas selected from the group consisting of helium, argon, xenon and krypton.

5. The method according to claim 1, wherein the second reactive ion process comprises generating a plasma from a gas mixture consisting essentially of CO, $C_4F_8$, $O_2$ and Ar.

6. The method according to claim 1, wherein the third reactive ion process comprises:
   exposing the anti-reflective layer to a first plasma generated from a gas mixture consisting essentially of $N_2$, CO and $O_2$; and
   exposing the second layer to a second plasma generated from a gas mixture consisting essentially of $CHF_3$, $CF_4$, $O_2$ and Ar.

7. The method according to claim 1, wherein the third reactive ion process comprises:
   exposing the anti-reflective layer to a first plasma generated from a gas mixture consisting essentially of $N_2$, and $H_2$ or $NH_3$; and
   exposing the second layer to a second plasma generated from a gas mixture consisting essentially of $CHF_3$, $CF_4$, $O_2$ a noble gas.

8. The method according to claim 1, wherein the fourth reactive ion process comprises generating a plasma from a gas mixture consisting essentially of $CHF_3$, $O_2$ and a noble gas.

9. The method according to claim 1, wherein shipping the photoresist, polymers and post etch residues from the substrate comprises:
   exposing a gas mixture to an energy source to form reactive ions, wherein the gas mixture consists essentially of ethylene, $O_2$ and nitrogen; and
   contacting the reactive ions with the substrate.

10. The method according to claim 1, wherein stripping the photoresist, polymers and post etch residues from the substrate comprises exposing a gas mixture to an energy source to form reactive ions, wherein the gas mixture consists essentially of $SO_2$, $O_2$ and argon.

11. The method according to claim 1, wherein stripping the photoresist, polymers and post etch residues from the substrate comprises exposing a gas mixture to an energy source to form reactive ions, wherein the gas mixture consists essentially of $N_2$, $H_2$, and $O_2$.

12. The method according to claim 1, wherein the second dielectric layer is non-polymeric hydrogenated oxidized silicon carbon.

13. The method according to claim 1, wherein the first dielectric layer is selected from the group consisting of tetraethylorthosilicate and silicon dioxide.

14. A method for removing a photoresist masking layer from a substrate, the method comprising:
    exposing a substrate with a first layer and a photoresist layer deposited onto the first layer to a reactive plasma, wherein a gas mixture for forming the plasma consists essentially of ethylene, oxygen and nitrogen; and
    selectively removing the photoresist layer from the first layer, wherein the first layer is substantially the same as before exposing the photoresist to the plasma.

15. The method according to claim 14, wherein a flow rate for ethylene gas is in a range from about 5 to about 20 sccm, a flow rate for the oxygen gas is in a range from about 10 to about 50 sccm and a flow rate for the nitrogen gas is in a range from about 10 to about 200 sccm.

16. The method according to claim 14, wherein the first layer comprises a low k dielectric material comprising Si, C, O and H.

17. The method according to claim 14, wherein the first layer comprises a non-polymeric hydrogenated oxidized silicon carbon.

18. The method according to claim 14, wherein the gas mixture consists essentially of $SO_2$, $O_2$ and a noble gas.

19. The method according to claim 14, wherein a dielectric constant of the first layer is substantially the seine as before the step of exposing the substrate to the reactive plasma.

20. The method according to claim 14, wherein the gas mixture consists essentially of $N_2$ and $H_2$, or $NH_3$ or $N_2H_2$ or a mixture thereof.

* * * * *